United States Patent [19]
Hammond et al.

[11] Patent Number: 6,163,602
[45] Date of Patent: Dec. 19, 2000

[54] SYSTEM AND METHOD FOR UNIFIED TELEPHONE AND UTILITY CONSUMPTION METERING, READING, AND PROCESSING

[76] Inventors: Scott H. Hammond, 883 Cornelius Rd., Rockwall, Tex. 75087; Douglas P. McCullough, 11 Silver Birch Ct., Wentzville, Mo. 63385; Robert H. Frantz, 8621 Crested Cove Ct., Plano, Tex. 75025

[21] Appl. No.: 09/292,643

[22] Filed: Apr. 15, 1999

[51] Int. Cl.[7] .................................................. H04N 15/00
[52] U.S. Cl. ........................ 379/114; 379/111; 379/112; 379/106.01; 379/106.03
[58] Field of Search ............................ 379/90.1, 91.02, 379/92.01, 92.03, 93.01, 93.05, 93.12, 93.14–93.15, 102.01–102.02, 106.01, 106.03, 106.11, 111–115, 120, 121, 127, 133–134

[56] References Cited

U.S. PATENT DOCUMENTS

| | | | |
|---|---|---|---|
| 5,682,422 | 10/1997 | Oliver | 340/870.02 |
| 5,684,965 | 11/1997 | Pickering | 705/34 |
| 5,852,658 | 12/1998 | Knight et al. | 379/106.03 |

OTHER PUBLICATIONS

Abstracts of Telcordia (formerly BellCore) specifications found on website http://www.telcordia.com, Apr. 4, 1999, for the following document numbers TR–TSY–000385, GR–1343, GR–2966, GR1100, GR–610, SR–2275.

Telcordia Technologies, "CMDS", Mar. 19, 1999, http://www.telcordia.com/solutions/operations/customer/cmds/index.html.

Michael Pierce, "Multi–party Payment Methods for Mobile Communications", Mar, 18, 1999, http://www.ntrg.cs.tcd.ie/mobile/mobpay.html.

Howard A. Scott, Ph.D., "1998 Pocket Guied to AMR Deployments", Pequannock, NJ 07440.

Illuminet, "LIDB Access and Transport", Apr. 7, 1999, Overland Park, Kansas, http://www.illuminetss7.com/local/lolidb.htm.

Prodata Systems Inc., "How Protel+ Works", Mar. 19, 1999, http://www.prodata.com/telephone/protel.htm.

MCL Systems Ltd., "Cadebill Ver. 2.0 Billing System for Telephony Service Providers", Mar. 19, 1999, http://www-.mclsystems.com/dacebill.html.

Cronus Technology Inc., "Saturn Subscriber Billing System", Dec. 28, 1998, http://www.cronus.com/ProductsSaturnSBS.htm.

Cronus Technology Inc., "Introducing Saturn Customer Care and Billing Products", Dec. 28, 1998, http://www.cronus.com/ProductsBilling&.htm.

Bellcore, "Section 5 Billing, Customer Data, and Control", Document No. SR–TSV–002275, Issue 2, Apr. 1994, "BOC Notes on the LEC Networks—1994", pp. 5–1 through 5–19.

Microlegend Telecom Systems Inc., "What is SS7?", Mar. 2, 1999, http://www.microlegend.com/whatss7.htm.

Travis Russell, "Signalling System #7", published by McGraw–Hill, New York City, NY, Copyright 1995, p. 278 Figure 8.3 and pp. 298 through 299 regarding TCAP operation codes.

Microlegend Telecom Systems Inc., "The SS7 Protocol Stack", Mar. 2, 1999, http://www.microlegend.com/stack.htm.

Microlegend Telecom Systems Inc., "Transaction Capabilities Application Part", Mar. 2, 1999, http://www.microlegend.com/tcap.htm.

(List continued on next page.)

*Primary Examiner*—Duc Nguyen
*Attorney, Agent, or Firm*—Robert H. Frantz

[57] ABSTRACT

The system and method provides a conversion and interface between automated meter reading systems and telephone billing systems to enable a telephone billing system to collect, process, and combine usage data of telephone and non-telephone services and products, such as water usage, natural gas consumption, electric power consumption, and long distance and toll call usage.

32 Claims, 4 Drawing Sheets

OTHER PUBLICATIONS

Microlegend Telecom Systems Inc., "MicroLegend VSP Versatile Signaling Point", Dec. 28, 1998, http://www.microlegend.com/home.htm.

Howard A. Scott, Ph.D., "AMR Deployments in North America", PowerValue magazine, Nov./Dec. 1998, pp. 18 through 28.

IEEE Standards Coordinating Committee 31, "IEEE Standard for Utility Telemetry Service Architecture for Switched Telephone Network", IEEE standard 1390–1995, Mar. 25, 1996.

"Volt VIEWTech Establishes Billing Service Bureau", Utility Automation magazine, Sep./Oct. 1998, pp. 54 and 55.

SYSTEM AND METHOD FOR UNIFIED TELEPHONE AND UTILITY CONSUMPTION METERING, READING, AND PROCESSING

FIELD OF THE INVENTION

The system and method of the invention pertains to the arts of automated meter reading of utility meters, such as electric power, water, and natural gas meters, and to the arts of automated multi-service multi-provider telephony billing systems and methods.

BACKGROUND OF THE INVENTION

The deregulation of gas, water, and electric utilities has paralleled in nature the deregulation of the telephone service industry. Prior to deregulation, utility services were legal monopolies which were controlled on a jurisdiction-by-jurisdiction basis. One company either produced the product and/or purchased the product in bulk (electric power, natural gas, water), maintained a physical network for distribution (cables, pipes, etc.), and provided service to residential, commercial and industrial consumers. Consumers did not have a choice as to what electric, water, or gas supplier to use.

Under the new, deregulated scheme, there are three categories of companies involved in producing and delivering electric power: product generators, the purchasing exchange, and the local service providers. For example, the electric producers will be responsible for operating electric power generation plants, such as coal, gas, nuclear or hydroelectric generators. The purchasing exchange will be responsible for collecting bids for product from the generators and consumption needs from the local service providers, placing orders to the providers to satisfy the needs of the consumers on a daily and possibly even an hourly basis. The local service providers are the end-user service provider, who manages customer accounts, provides customer service, and generates daily or hourly bids for product to the purchasing exchange. Since the electric power industry has been relatively slow in adopting new technology in the past several decades, none of these companies are well situated to handle the collection of billing data, sorting of the data based on consumer and supplier, and integration of that data into invoices, usage reports, and the like.

The problem is further complicated by the fact that electric power will be bought and sold on an exchange on a daily basis, which is not well supported by the current monthly usage data collection and processing methods and systems. This means, in order to get the best price available and the closest actual quantity of power to be consumed, the purchasing exchange and the local service providers need to have very accurate and recent data on the consumption of power by their customer base. This drives a need to collect usage readings on a frequent basis, such as a daily or hourly basis, rather than the traditional manually collected usage readings which are collected monthly. The cost of manually-read daily and hourly readings is prohibitive, so some sort of automated reading system is needed to collect usage data on a daily basis. This situation exists for water meters and gas meters, as well.

In the prior art, there are many automated meter reading ("AMR") systems from several companies. Companies such as CellNet, Hunt Technologies, Inc., Itron, and Schlumberger have AMR systems developed and deployed, as discussed in "AMR Deployments in North America", by Howard A. Scott, Ph.D., published in PowerValue magazine, November of 1998. Some of these systems use telephone lines and modems to communicate meter reading data from the point-of-consumption meter to a centralized collection system, while others use radio frequency ("RF") carrier or power line carrier ("PLC") to accomplish the same. The "1998 Pocket Guide to AMR Deployments", prepared by Howard A. Scott, Ph.D., published by the Automated Meter Reading Association ("AMRA"), also describes the state of installed AMR systems, their telemetry technology and architectures.

Due to the cost of producing, installing and operating AMR systems, they traditionally have only been applied to large-volume industrial and commercial consumers. Additionally, these systems use proprietary database means in order to store the data, and proprietary collection technology to transmit usage data from the points of consumption ("POC") to the centralized database. These database systems are particularly unsuitable for usage in integrating consumption data from several suppliers in the new, deregulated utility environment because they were originally designed with the assumption that the operator of the billing system is one and the same as the service producer and provider. This sudden change in business environment coupled with out-of*date technology status at the utility companies has given rise to a substantial need and desire to outsource billing services to third parties. The trend towards outsourcing of billing and customer service is described well in industry articles such as "Utilities Step Up to Outsourcing", in Utility Business magazine, published July, 1998, and also in "Volt VIEWTech Establishes Billing Service Bureau", in Utility Automation magazine, published in September of 1998.

Turning now to the telephone service industry, a similar monopolistic arrangement was divested and deregulated over 15 years ago, thereby providing room in the industry for many types of companies. There are companies which carry only long distance traffic, companies which provide only toll-free (800) and toll (900) call services, and local service providers (Regional Bell Operating Companies or "RBOCs") The competitiveness of the new industry has been strong, resulting in innovative new services, methods of charging for services, and in some cases, considerable decreases in cost of services. The RBOCs have enjoyed a protection from competition in the local service provider as long as the RBOCs themselves provide only local telephone service. The RBOCs have been responsible for unified billing service to the customers, integrating usage data from all of the various service providers into a single database, single invoice, and single usage report. Underlying all of this capability are several methods of data collection, including manual methods of data transfer such as the physical transport of magnetic tapes, and automated methods including Bell Communications Research's ("BellCore") Automated Message Accounting Teleprocessing System ("AMATPS"), Automated Message Accounting Data Network Service ("AMADNS"), and the American National Standards Institute ("ANSI") Signaling System 7 ("SS7") Transaction Capabilities Application Part ("TCAP").

A general overview of the billing data collection and processing approach used in BellCore-compliant systems is given in BellCore Notes on the Network, 1994, Section 5, and is well known within the art, as well as specific standards for AMATPS, AMADNS, and the BellCore AMA Record Format ("BAF").

Signaling System 7 standards such as the American National Standards Institute ("ANSI") ANSI T1.110-1992 "Telecommunications—Signaling System No. 7—General Information", and ANSI T1.114-1996

"Telecommunications—Signaling System Number 7—Transaction Capabilities Application Part (TCAP)", are well-known within the telecommunications art. The book "Signaling System #7" by Travis Russell, published by McGraw-Hill 1995, also provides a useful overview and details of the SS7 network, capabilities, and protocols.

Within the telephone network and protocols are capabilities for any telephony service provider to create usage records, referred to by several terms including Call Detail Record ("CDR") and Message Data Recording ("MDR"). These records are typically created by the service provided at the terminating end, or "called party" end, of the telephone routing. For example, if a subscriber dials a number which results in a charge from the service provider of the dialed number, the service provider creates a record of the calling party's telephone number, time of start of service, and time of end of service. If the service provider has several services available at the same telephone number, the record may also include an indication of which service(s) were consumed. The telephone switch equipment at the service provider's facility maintains the records in a persistent memory means, such as a database.

Periodically, the Message Detail Records are collected by various billing service companies or Revenue Accounting Offices ("RAO"). These records can be collected through a variety of means, such as dial-up modem connections, dedicated data connections, or networked data connections including Transmission Control Protocol/Internet Protocol ("TCP/IP), and using a number of protocols to transfer the data, including the BellCore AMATPS or AMADNS, ANSI SS7 TCAP or proprietary protocols.

The RAO's collect all of the MDR for the subscribers for whom the RAO is required to process invoices. After the periodic collection of MDR is complete, data processing on the records to create subscriber invoices is performed, including a process called "rating" in which the subscriber's profile is used to determine particular prices and rates of each service consumed.

Many RBOCs operate proprietary or custom billing and maintenance databases which interface to the telephone network to perform MDR collection, but some third parties offer software packages designed for telephone billing and maintenance, such as the Saturn Customer Care and Billing Product from Cronus Technology, Inc. The Saturn product includes usage reconciliation and settlement functionality, subscriber billing capabilities, provisioning, rating (the process of charging different service rates depending on time, date, day, and quantity consumed), and invoicing for telephone services. Further, a flexible MDR import capability allows the Saturn to receive MDR in a variety of standard, such as BAF, records and non-standard or proprietary record formats.

Another standard of interest in the prior art is Institute of Electrical and Electronic Engineers ("IEEE") Standard for Utility Telemetry Service Architecture for Switched Telephone Network, IEEE Standard 1390-1995, supported by the Automated Meter Reading Association ("AMRA"). This standard sets forth a method for connecting the automated meters to the centralized utility collection systems through the switched telephone network, disabling certain analog electronic telephony characteristic, such as ring signal, to initiate a connection to the automated meter. This is intended to allow the utility collection system to initiate contact with the automated meter via a dial-up telephone call without causing the telephones at the consumer's premise to ring, but the equipment collecting the meter reading data is not a telephony billing system as used by the AMATPS, AMDNS, and SS7 networks.

A fundamental difference in the metering technology between the telephone network and utility networks is the point at which the metering is performed. Telephone services are metered, or measured, at the source of the service, such as the RBOC. In other words, call durations, origins, and destinations are recorded at the "central office", not at the point of consumption, or the home or office. Electric, gas, and water services are measured at the point of consumption, such as the house or industrial site, not at the source.

Commercially, the RBOCs have found themselves in a relatively uncompetitive stance to enter many of the other non-local-service markets, such as Internet Service Provider (ISP), alternative long distance, call centers (800 and 900 services), and cable television. All of these other markets are aggressively covered by well established players, so the RBOCs are in a position to look for other revenue streams.

So, a commercial opportunity is defined by the RBOCs having a highly distributed, powerfully networked multi-service multi-provider billing capability which is well-established and cost effective. Further, the RBOCs have a strong desire tc take on new business and service lines. Concurrently, the utility service providers need an outsource supplier of billing services. But, the technology of the two parties is fundamentally incompatible within the systems of the prior art.

The following references, standards, and journal publications provide information as to the technical and commercial background to the invention:

1. "AMR Deployments in North America", by Howard A. Scott, Ph.D., published in PowerValue magazine, November of 1998.
2. "1998 Pocket Guide to AMR Deployments", prepared by Howard A. Scott, Ph.D., published by the Automated Meter Reading Association.
3. "Utilities Step Up to Outsourcing", Utility Business magazine, published July, 1998.
4. "Volt VIEWTech Establishes Billing Service Bureau", in Utility Automation magazine, published September of 1998.
5. Section 5 "Billing, Customer Data, and Control", BOC Notes on the LEC Network, document number SR-TSV-002275, Bell Communications and Research, 1994.
6. "Automatic Message Accounting Teleprocessing System (AMATPS) Generic Requirements", document number TR-TSY-000385, Issue 1 with Revision 1, published February 1990 by Bell Communications and Research.
7. "Generic Requirements for the Automatic Message Accounting Data Networking System (AMADNS)", document number GR-1343-CORE, Issue 1, published February 1994 by Bell Communications and Research.
8. "Bellcore Automatic Message Accounting Format (BAF) Requirements", document number TR-NWT-001100, Issue 2, published February 1993 by Bell Communications and Research.
9. "Message Detail Recording (MDR)", document number FSD 02-02-1110, Issue 1, published October 1993 by Bell Communications and Research.
10. "Signaling System #7" by Travis Russell, published by McGraw-Hill, copyright 1995.
11. "How Protel+ Works", published by Prodata Systems, Inc., Mar. 19, 1999, at http://www.prodata.com/telephone/protel.htm.

12. "Cadebill® Version 2.0 Billing System for Telehpony Service Providers", published by MCL Systems Limited, Mar. 19, 1999, at http://www.mclsystems.com/cadebill.html.
13. "MicroLegend SS7 Tutorial: What is SS7", published by MicroLegend Telecom Systems, Inc., Mar. 2, 1999, at http://www.microlegend.com/whatss7.htm.
14. "MicroLegend SS7 Tutorial: The SS7 Protocol Stack", published by MicroLegend Telecom Systems, Inc., Mar. 2, 1999, at http://www.microlegend.com/stack.htm.
15. "MicroLegend SS7 Tutorial: Transaction Capabilities Application Part", published by MicroLegend Telecom Systems, Inc., Mar. 2, 1999, at http://www.microlegend.com/tcap.htm.
16. "MicroLegend VSP", published by MicroLegend Telecom Systems, Inc., Dec. 28, 1998, at http://www.microlegend.com/home.htm.
17. "Introducing Saturn Customer Care and Billing Products", published by Cronus Technology Inc., Dec. 28, 1998, at http://www.cronustech.com/ProductsBilling&.htm.
18. "Saturn Subscriber Billing System", published by Cronus Technology Inc., Dec. 28, 1998, at http://www.cronustech.com/ProductsSatumSBS.htm.
19. "Signalling System Number 7 (SS7)—Transaction Capabilities Application Part (TCAP)", document number T1.114-1996, published by American National Standards Institute in 1996.
20. "IEEE Standard for Utility Telemetry Service Architecture for Switched Telephone Network", document number 1390-1995, published in 1995 by the Institute of Electrical and Electronic Engineers.

Therefore, there exists a need in the art for a system and method to integrate and interface telephone billing systems to semi-automated and automated meter reading systems.

There further exists a need in the art for this system and method to provide flexible compatibility to receive data from prior art AMR systems, and to submit billing data to prior art telephone service billing systems.

SUMMARY OF THE INVENTION

The system and method of the invention provides a interface and conversion between the paradigms of automated meter reading systems and multi-service multi-provider telephony billing systems to enable operators of telephony billing systems and services to further integrate and operate on non-telephone billing data, such as usage data for water, gas, and electrical power.

The system and method to integrates and interfaces telephone billing systems to semi-automated and automated meter reading systems. Further, it provides flexible compatibility to receive data from prior art automated meter reading systems, and the ability to submit billing data to prior art telephone service billing systems.

DETAILED DESCRIPTION OF THE INVENTION

In order to achieve the objects of the invention as set forth in the SUMMARY OF THE INVENTION, the following description of the invention is given in conjunction with the figures presented herein.

Figure 1:
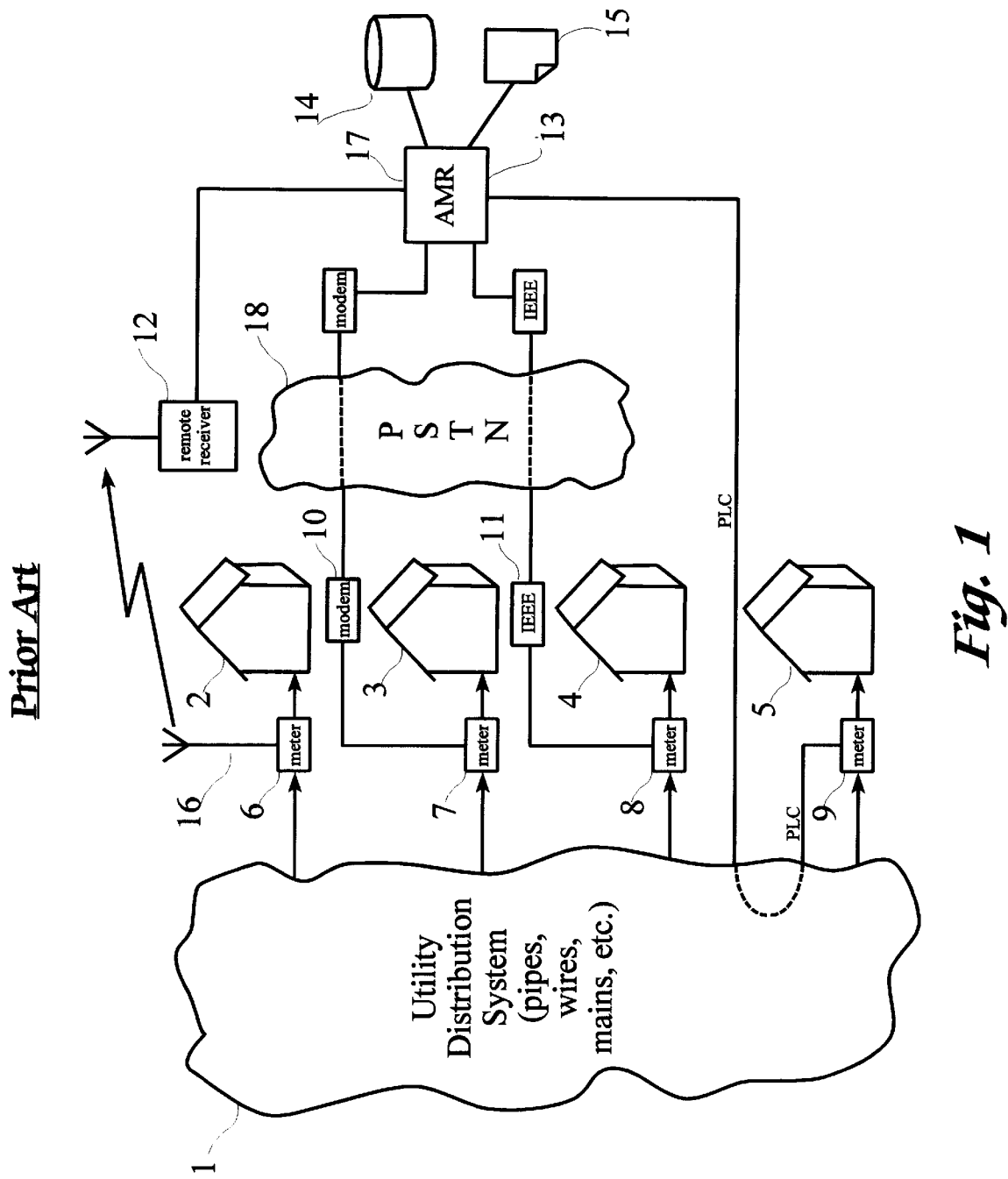

Turning first to FIG. 1, the current automated meter reading ("AMR") paradigm for non-telephone utilities is depicted. Meters (6, 7, 8, 9) which measure utility product consumption at the point of consumption are co-located with the consuming facilities (2, 3, 4, 5), such as residential homes, apartment complexes, factories, office buildings, and retail buildings. The utility product, such as gas, water, or electric power, flows through the meter from a utility distribution network (1) which may include wires, transformers, pipes, mains, etc., and is delivered to a network of conduits within the consumer's facilities (2, 3, 4 5).

Some AMR meters use wireless communications technology, including a transmitting antenna (16) co-located with the meter (6), and a remote receiver (12). Other AMR meters use modems (7, 10) or IEEE-1390 interfaces (8,11) connected to the public switch telephone network (18) ("PSTN"), while still other meters use a method of data transmission over power lines known as power line carrier ("PLC"). The AMR collection system (17) collects the data from the remote meters, stores it in a local database (14), and periodically produces reports and invoices (15).

Figure 2:
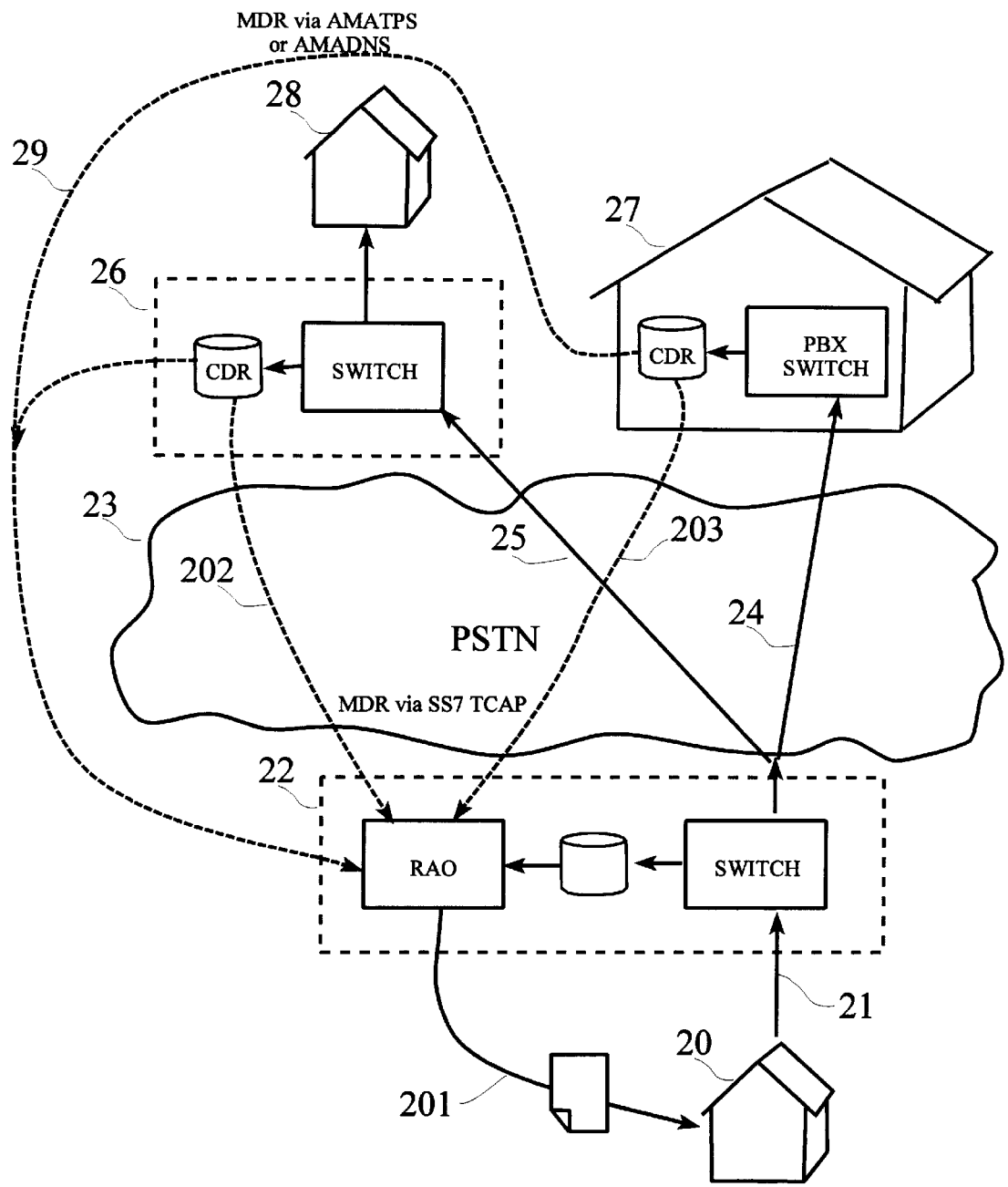

FIG. 2 depicts the current systems and methods used for multi-party, multi-provider telephony metering and billing. A consumer, in this case the "calling party", originates a call and consumption of a telephony service from his or her home or place of business, which is carried from the place of origination (20) via local loop telephone wires (21) to a switch within the local Bell Operating Company (22). Based on the digits dialed by the caller, the call is switched through the PSTN (23) to a terminating switch. If the destination, or called party, is a residential or small commercial entity (28), the terminating switch is operated by the Bell Operating Company at the terminating end (26). If the destination is a larger commercial entity (27), the call may be delivered to a private branch exchange (PBX) located on the premises of the called party. In either case, a local record of the call session, including the calling party's telephone number, the session start time, the session end time, and possibly other relevant data is created by and stored at the called party's switch. This record is called a "Call Detail Record" ("CDR") or "Message Detail Recording" ("MDR").

In order for the calling party's local Bell Operating Company ("BOC") to create a consolidated invoice and report for all of the services consumed during a particular time period, the BOC may operate or contract to a Revenue Accounting Office ("RAO"), as it is called by the BellCore definitions. The RAO operates equipment which periodically polls (29) the service providers' databases to collect the MDR using Bellcore Automated Message Accounting Teleprocessing System ("AMATPS") or Automated Message Accounting Data Networking System ("AMADNS"). The records may be in a proprietary format, or they may be in a standard Bellcore format known as Bell AMA Format ("BAF").

In the more advanced telephone network using Signaling System 7, the service provider's databases may initiate a transfer (202, 203) of the MDR to the RAO using a "Bill Call" transaction of the Transaction Capabilities Application Part ("TCAP") of SS7.

Figure 4:
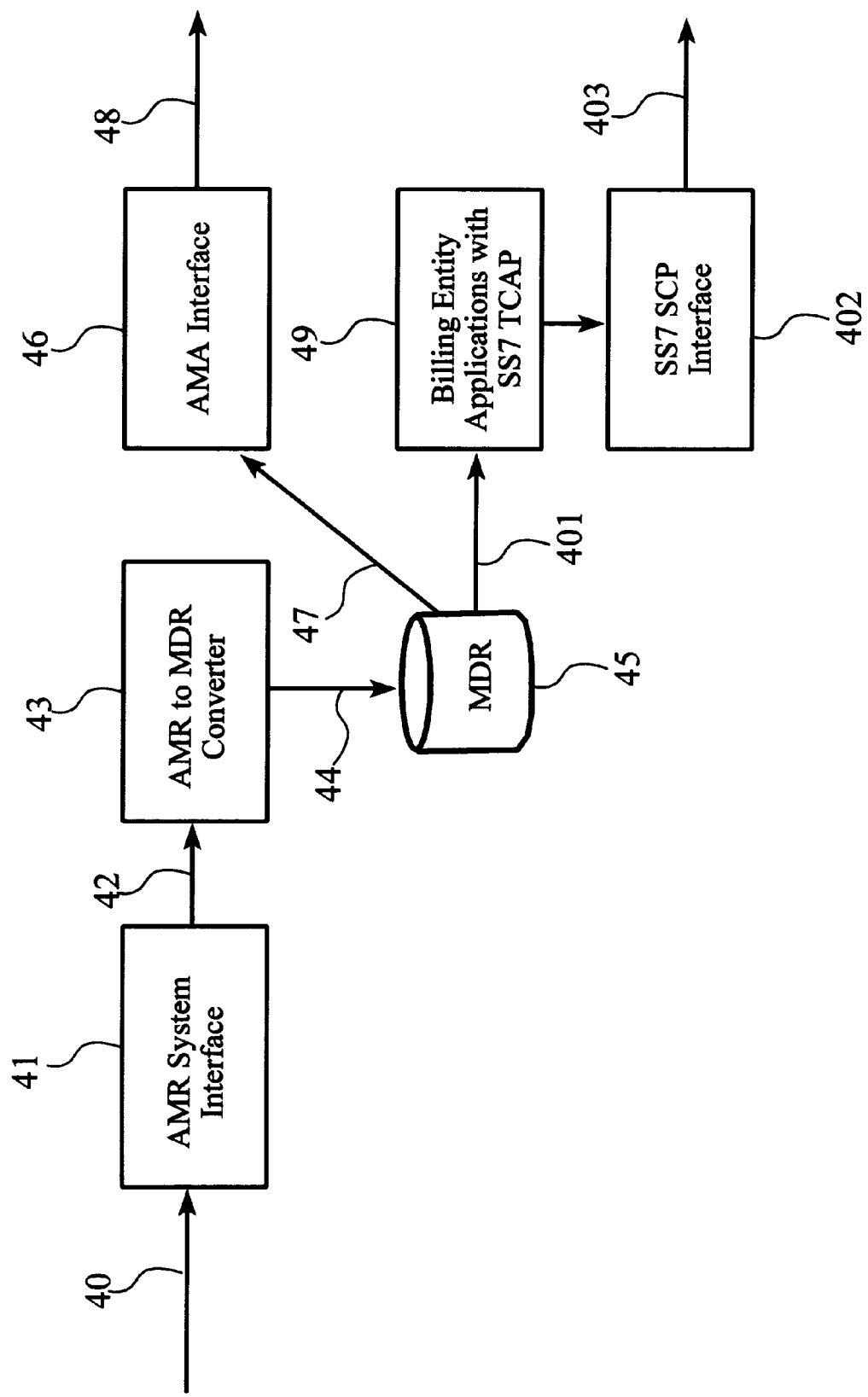

The block diagram of the invention is shown in FIG. 4, which includes an means for receiving AMR consumption records (40) from an AMR collection system, such as the one shown in FIG. 1, reference identifier 17. This reception means may include a shared database interface, a local area network ("LAN"), an Internet, or a dialup modem connection. The AMR system interface (41) periodically collects the consumption records from the AMR collection system, and if any new records are present, activates the AMR to MDR converter (43). The AMR to MDR converter (43) processes the consumption records into a MDR record, and stores that in an MDR database (45). The processing can be performed using an application program, preferrably developed in "C", running on a computer, such as an IBM-compatible personal computer, with an operating system, such as Microsoft Windows NT. Included in this processing is the calculation of the actual usage of the particular commodity based on the most recently received meter reading and the previously received meter reading for a particular consumer. The MDR is tagged by consumer's telephone number, so a conversion database or table is implemented within the converter which relates a consumer's telephone number to the consumer's physical address and point of consumption of the non-telephone product or service. The AMR to MDR converter (43) may create proprietary MDR, or it may create standardized MDR, such as BAF format records. Optionally, a rate plan may be applied by the converter to generate a cost value of the units consumed.

In the preferred embodiment, an automated message accounting ("AMA") interface (46) is interconnected to a network (48), such as the PSTN with a modem or the Internet with a LAN network interface card, such that a RAO, as shown in FIG. 2, can initiate data connections with the AMA interface (46) and initiate a transfer of the MDR from the MDR database (45) to the RAO using the methods of AMATPS and AMADNS. The AMA interface (46) implements the AMA transmitter ("AMAT") functionality as defined in the Bellcore AMATPS and AMADNS standards. The AMR interface (48) preferably accesses the MDR database (45) through an open database interface (47) such as ODBC, as well as the AMR to MDR converter may access the database in the same manner (44).

In an alternate embodiment intended for use with the Advanced Intelligent Network, using a Signaling System 7 Signal Control Point ("SCP") (402) with a billing entity application program using SS7's Transaction Capability Application Part ("TCAP") (49) functionality, the MDR can be transmitted periodically to the RAO using a "bill call" dialog over the SS7 network. Further, in this implementation, other SS7 TCAP dialogs can be used to query the consumer's local BOC for a conversion from the consumer's address to telephone number, in some SS7 systems. The SCP and TCAP functionalities can be implemented using a number of third party gateway platforms, such as the Microlegend VSP Versatile Signaling Point.

The RAO may operate a proprietary data collection method and format on a proprietary platform. Customer care and billing systems such as the Cronus Technology Saturn system, the MCL Systems Cadebill (R) product, or the Prodata Systems Protel+ product can be used to receive the optimal format MDR from the AMR to MDR converter (43). These systems also provide for the processing of the data according to multiple rate plans, production of customer invoices, and production of a wide variety of statistical reports useful for maintaining and operating the RAO.

Figure 3:
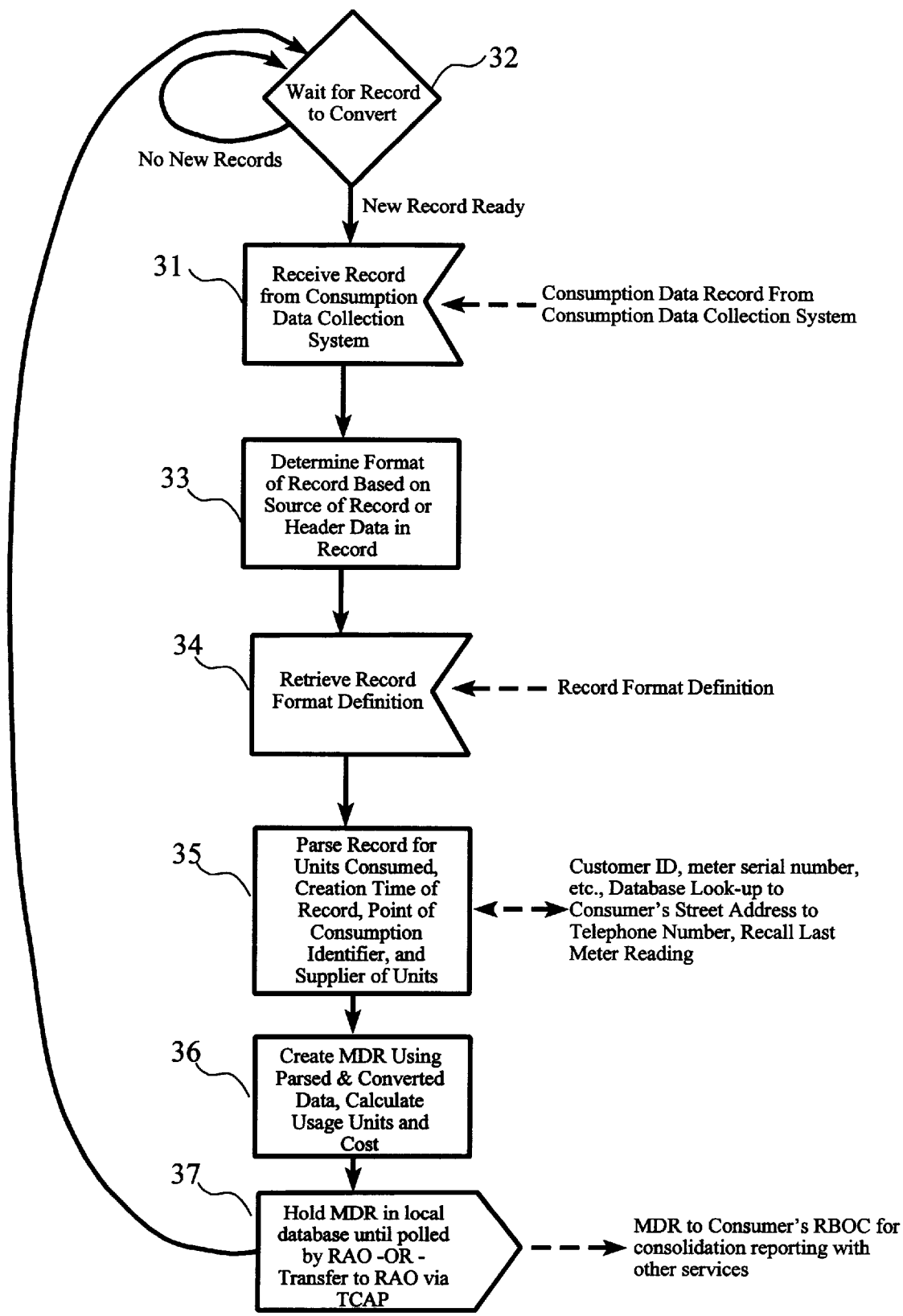

FIG. 3 illustrates the method implemented in the AMA to MDR converter. In it's normal state (32), the method is waiting for a new consumption record to convert by periodically polling the AMR interface, which in turn polls the AMR collection system. When a new consumption record is received (31), the format of the consumption record is determined (33) by one or more of several common techniques, including simple identification of the AMR collection system from which the record was received or parsing of a record header to determine the format, both of which are well known record processing and recognition techniques within the art. Then, a descriptor for the record format is retrieved (34) from a repository of record formats, with the descriptor indicating which bytes and bits within the record are to be used for the consumer's identification, consumer's address, meter reading, provider's identification, and time of the meter reading. Using the record descriptor, the consumption record is parsed (35) for these items, which can temporarily be stored as individual variables. Then, by re-combining the data stored in the variables into a MDR format, an MDR record is created (36), which includes a calculated usage amount based on recalling the last meter reading for that consumer and subtracting that from the previous meter reading, the time of the record, an indication of the supplier of the service or product, and the telephone number of the consumer based on a look-up of the address in a telephone number directory database. Optimally, a rating plan would also be applied to the consumption value to generate a cost value, but this may alternatively be performed by the RAO. Finally, the MDR is stored in the MDR database (37) or transferred to the RAO using SS7 TCAP dialogs. The system and method then returns to its normal state (32), waiting and polling for new consumption records to convert.

The invention described herein sets forth certain aspects believed to be the best mode of implementation of the conversion and interface system to allow non-telephone utility usage records to be incorporated and processed by typical telephone billing systems. It will be appreciated by those skilled in the art that substitutions for certain elements, and minor deviations in the steps taken or the order of the steps does not depart from the spirit and scope of the invention.

What is claimed is:

1. A unified billing system for collecting, combining, and processing telephone and non-telephone utility usage and charge records into unified billing and usage reports, comprising:

at least one remotely readable utility meter, said utility meter having a remote reading output and communicating a current utility meter reading value;

a remote meter reading media, communicably connected to said remote reading output of said remotely readable utility meter;

at least one automatic meter reading receiver having a meter reading input for receiving a utility meter reading value from a remotely readable utility meter via the remote reading media, such that utility meter readings from said utility meter are received at said meter reading input via said meter reading media, and said meter reading receiver further comprising a first data interface such that utility usage records are output at said first data interface in response to receipt of said utility meter readings; and a billing converter system comprising:

a second data interface, communicably interconnected to said first data interface of said automatic meter reading receiver and receiving said utility usage records;

a processing computer means suitable for executing software, including a persistent data memory means;

a telephony billing system interface means for Transmitting telephony billing records to telephony billing accounting systems; and an application program means executed by said processing computer means, said application program means providing automatic conversion of utility usage records to telephony billing records, said telephony billing records being output at said telephony billing system interface means.

2. The unified billing system of claim 1 wherein said first and second data interfaces further comprise local area network interfaces.

3. The unified billing system of claim 1 wherein said first and second data interfaces further comprise Internet interfaces.

4. The unified billing system of claim 1 wherein said first and second data interfaces further comprise dial-up telephony modems.

5. The unified billing system of claim 1 wherein said first and second data interfaces further comprise database application interfaces.

6. The unified billing system of claim 1 wherein said processing computer means further comprises an IBM-compatible personal computer, including random access memory, hard drive, and an operating system.

7. The unified billing system of claim 1 wherein said telephony billing system interface means further comprises a dial-up telephony modem.

8. The unified billing system of claim 1 wherein said telephony billing system interface means is a local area network interface.

9. The unified billing system of claim 1 wherein said telephony billing system interface means further comprises an Internet interface.

10. The unified billing system of claim 1 wherein said telephony billing system interface means further comprises a database application interface.

11. The unified billing system of claim 1 wherein said telephony billing system interface means further comprises a Signaling System #7 Service Control Point.

12. The unified billing system of claim 1 wherein said telephony billing system interface means further comprises a record transmission protocol means.

13. The unified billing system of claim 12 wherein said record transmission protocol means further comprises Signaling System #7 Transaction Capabilities Application Part means.

14. The unified billing system of claim 12 wherein said record transmission protocol means further comprises an Automatic Message Accounting Teleprocessing System emulation means.

15. The unified billing system of claim 12 wherein said record transmission protocol means further comprises an Automatic Message Accounting Data Networking System emulation means.

16. The unified billing system of claim 1 wherein said telephony billing records further comprise records in the Bellcore Automated Message Accounting Format.

17. The unified billing system of claim 1 wherein said remote meter reading media further comprises a modulated radio frequency channel with a radio frequency transmitter disposed at said remotely readable utility meter and a radio frequency receiver disposed at said automatic meter reading receiver.

18. The unified billing system of claim 1 wherein said remote meter reading media further comprises a telephone network and telephony modems.

19. The unified billing system of claim 1 wherein said remote meter reading media further comprises an electrical power distribution network with power line carrier modems.

20. A method for automatically collecting, combining, and processing telephone and non-telephone utility usage and charge records into unified billing and usage reports, comprising the steps of:

periodically receiving a utility meter reading record from an automatic meter reading system via a data interface to said automatic meter reading system;

parsing said meter reading record for a current meter reading value and a consumer identifier;

calculating a units consumed value by recalling a previous meter reading value associated with said consumer identifier and subtracting that value from said current meter reading value;

associating a telephone number with said consumer identifier;

creating a telephony billing record comprising a units consumed value and the telephone number associated with the consumer identifier; and collecting said telephony billing record using a telephony billing system thereby combining said utility reading with telephony-related records for processing into a unified billing invoice and usage record.

21. The method of claim 20 wherein said step of periodically receiving a utility meter reading record further comprises the receipt of a data message via a local area network.

22. The method of claim 20 wherein said step of periodically receiving a utility meter reading record further comprises the receipt of a data message via an Internet.

23. The method of claim 20 wherein said step of periodically receiving a utility meter reading record further comprises the receipt of a data message via a dial-up modem connection.

24. The method of claim 20 wherein said step of periodically receiving a utility meter reading record further comprises the receipt of a data message via database interface.

25. The method of claim 20 wherein said step of parsing a meter reading record further includes the step of parsing for a record format indicator which indicates the locations within the meter reading record of the consumer identifier and the current meter reading value.

26. The method of claim 20 wherein said step of parsing a meter reading record further includes the step of parsing the record for a service provider indicator and the step of creating a telephony billing record includes a step of associating a service provider identifier with said telephony billing record.

27. The method of claim 20 wherein said step of calculating a units consumed value further comprises a step of calculating a monetary value of units consumed by applying a rate rule to said units consumed value.

28. The method of claim 20 wherein said step of creating a telephony billing record includes a step of associating a cost value with said telephony billing record.

29. The method of claim 20 wherein said step of creating a telephony billing record includes a step of formatting said telephony billing record into Bellcore Automated Message Accounting Format.

30. The method of claim 20 wherein said step of collecting said telephony billing record using a telephony billing system further comprises an Automated Message Accounting Teleprocessing System method of billing record transmission.

31. The method of claim 20 wherein said step of collecting said telephony billing record using a telephony billing system further comprises an Automated Message Accounting Data Networking System method of billing record transmission.

32. The method of claim 20 wherein said step of collecting said telephony billing record using a telephony billing system further comprises a Signaling System #7 Transaction Capabilities Application Part billing database transaction method of billing record transmission.

* * * * *